(12) United States Patent
Kim

(10) Patent No.: US 7,875,490 B2
(45) Date of Patent: Jan. 25, 2011

(54) IMAGE SENSOR AND METHOD FOR MANUFACTURING THE SAME

(75) Inventor: Jong-Man Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 222 days.

(21) Appl. No.: 12/344,496

(22) Filed: Dec. 27, 2008

(65) Prior Publication Data

US 2009/0194836 A1  Aug. 6, 2009

(30) Foreign Application Priority Data

Dec. 27, 2007  (KR) .................... 10-2007-0139468

(51) Int. Cl.
*H01L 21/00* (2006.01)
*H01L 31/00* (2006.01)
(52) U.S. Cl. .................. 438/73; 257/293; 257/E31.001
(58) Field of Classification Search .................. 257/213, 257/215, 216, 222, 223, 225, 231, 233, 288, 257/290–294, 414, 428, 431, 443, E31.001, 257/E25.01, E25.029, E25.03, E25.032; 438/57–98
See application file for complete search history.

(56) References Cited

U.S. PATENT DOCUMENTS 6,325,977 B1 * 12/2001 Theil ........................ 422/82.05

* cited by examiner

*Primary Examiner*—Minh-Loan T Tran
*Assistant Examiner*—Kevin Quinto
(74) *Attorney, Agent, or Firm*—Sherr & Vaughn, PLLC

(57) ABSTRACT

An image sensor includes a semiconductor substrate including circuitry, an interlayer dielectric including metal lines arranged on the semiconductor substrate, crystalline photodiode patterns arranged on the interlayer dielectric such that the photodiode patterns are connected to the metal lines, hard mask patterns arranged on the respective photodiode patterns, a device-isolation trench interposed between the adjacent photodiode patterns, to isolate the photodiode patterns from each other, a barrier film implanted with impurity ions, arranged into the inner wall of the device-isolation trench, and a device-isolation insulating layer arranged over the interlayer dielectric including the photodiode pattern and the device-isolation trench.

20 Claims, 3 Drawing Sheets

IMAGE SENSOR AND METHOD FOR MANUFACTURING THE SAME

Figure 1:
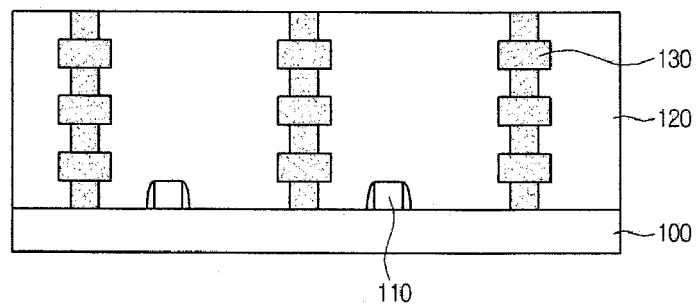

The present application claims priority under 35 U.S.C. 119 to Korean Patent Application No. 10-2007-0139468 (filed on Dec. 27, 2007), which is hereby incorporated by reference in its entirety.

BACKGROUND

Image sensors are generally semiconductor devices which can convert optical images into electrical signals. Such image sensors can typically be classified as either charge coupled device (CCD) image sensors or complementary metal oxide silicon (CMOS) image sensor (CIS). CMOS image sensors include photodiodes and MOS transistors in unit pixels that detect electrical signals in the respective unit pixels in a switching mode, thereby realizing an image. Some CMOS image sensors may have a structure that includes a photodiode portion, to convert light signals into electrical signals, and a transistor portion, to handle the electrical signals, which are horizontally arranged. In other words, horizontal CMOS image sensors have a structure in which photodiodes and transistors lie horizontally adjacent to each other on a substrate. Accordingly, horizontal CMOS image sensors include an additional region where photodiodes may be formed, which decreases a fill factor region and limits resolution.

SUMMARY

Embodiments relate to an image sensor, and a method for manufacturing the same, that include vertical integration of transistor circuitry and photodiodes, that may maximize resolution as well as sensitivity, and that may reduce, or prevent, photodiode defects.

Embodiments relate to an image sensor that includes: a semiconductor substrate including circuitry; an interlayer dielectric including metal lines arranged on the semiconductor substrate; photodiode patterns arranged on the interlayer dielectric such that the photodiode patterns are connected to the metal lines; hard mask patterns arranged on the respective photodiode patterns; a device-isolation trench interposed between the adjacent photodiode patterns, to isolate the photodiode patterns from each other; a barrier film arranged on the inner wall of the device-isolation trench; and a device-isolation insulating layer arranged over the interlayer dielectric including the photodiode patterns and the device-isolation trench.

Embodiments relate to a method for manufacturing an image sensor that includes: forming a semiconductor substrate including circuitry; forming an interlayer dielectric including a metal line on the semiconductor substrate; forming a photodiode on the interlayer dielectric such that the photodiode is connected to the metal line; forming a hard mask pattern on the photodiode to form a photodiode pattern including a device-isolation trench; forming a barrier film on the inner wall of the device-isolation trench; and forming a device-isolation insulating layer over the interlayer dielectric including the photodiode pattern and the device-isolation trench.

DRAWINGS

Example FIGS. 1 to 7 are sectional views illustrating a process for manufacturing an image sensor according to embodiments.

DESCRIPTION

Figure 7:
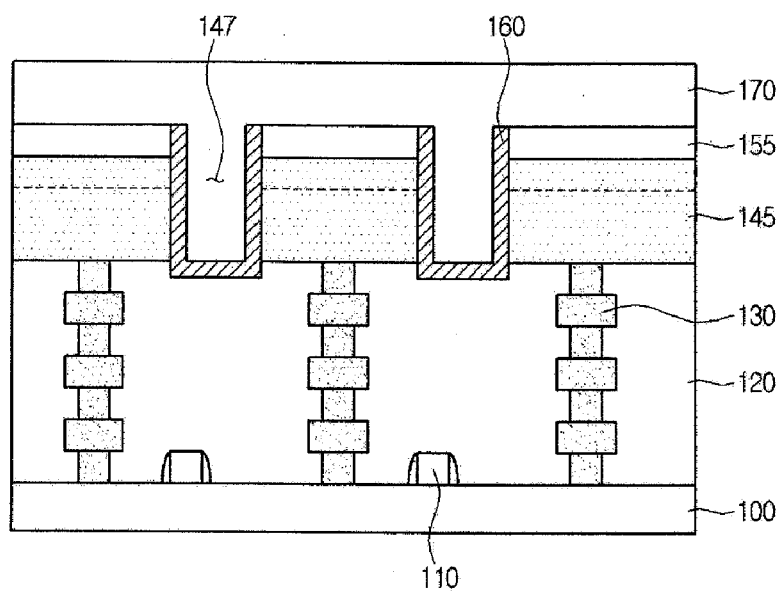

Example FIG. 7 is a sectional view illustrating an image sensor according to embodiments. The image sensor can include a semiconductor substrate 100 provided with circuitry 110, an interlayer dielectric 120 provided with metal lines 130 arranged on, or over, the semiconductor substrate 100, photodiode patterns 145 arranged on, or over, the interlayer dielectric 120 such that the photodiode patterns 145 are connected to the metal lines 130, hard mask patterns 155 arranged on, or over, the respective photodiode patterns 145, a device-isolation trench 147 interposed between the photodiode patterns 145, to isolate the adjacent photodiode patterns 145, a barrier film 160 arranged on, or over, the inner wall of the device-isolation trench 147 and a device-isolation insulating layer 170 arranged over the interlayer dielectric 120 including the photodiode pattern 145 and the device-isolation trench 147.

The barrier film 160 may be formed of a P-type impurity. For example, the barrier film 160 may be formed on the side of the photodiode pattern 145 by injecting $BF_2$ ions, for example, thereon through the device-isolation trench 147. By forming the barrier film 160 on the side of the photodiode pattern 145, surface defects occurring upon etching of the photodiode pattern 145 can be reduced, or eliminated, and dark current and low luminance properties can be improved.

Referring to example FIG. 1, metal lines 130 and an interlayer dielectric 120 may be formed on, or over, a semiconductor substrate 100. The semiconductor substrate 100 may, for example, be a mono- or polycrystalline silicon substrate and may be a substrate doped with a P- and/or N-type impurity. Also, the semiconductor substrate 100 may include a device-isolation film to define an active region and a field region. In addition, transistor circuitry including transfer transistors connected to the photodiodes, to convert received photocharges into electrical signals, reset transistors, drive transistors and select transistors may be formed in respective unit pixels in the active region.

An interlayer dielectric 120 including metal lines 130 to connect the circuitry with power lines or signal lines may be formed on the semiconductor substrate 100 as well. The interlayer dielectric 120 may, for example, be a multi-layer structure comprising a plurality of layers. The metal lines 130 may include lower metal lines and plugs and may be formed in respective unit pixels on the semiconductor substrate 100, and, thereby, transfer photocharges from the photodiode to the circuitry 110. The metal lines 130 may be formed of a variety of conductive materials including metals, alloys or silicide. For example, the metal lines 130 may be formed of aluminum, copper, cobalt or tungsten. According to embodiments, the plug of the metal lines 130 may be exposed to the surface of the interlayer dielectric 120. Also, upon forming the metal lines 130, pads may be formed in the adjacent circuit region.

Figure 2:
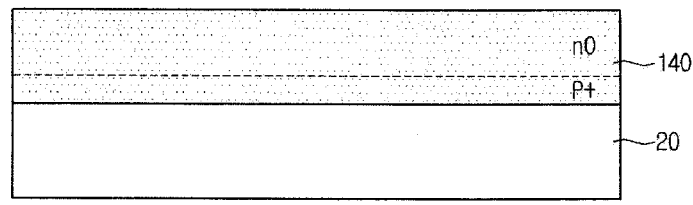

Referring to example FIG. 2, a crystalline semiconductor substrate 20 is prepared. The crystalline semiconductor substrate 20 may be a mono- or poly-crystalline silicon substrate and may be a substrate doped with a P- and/or N-type impurity. In example FIG. 2, the crystalline semiconductor substrate 20 may, for example, be a P-type substrate. In addition, the semiconductor substrate 100 and the crystalline semiconductor substrate 20 may be substantially the same size and an epilayer may be formed on the crystalline semiconductor substrate 20.

A photodiode 140 may be formed on, or over, the crystalline semiconductor substrate 20. The photodiode 140 may comprise an N-type impurity region and a P-type impurity region which may come in contact with each other to form a PN-junction photodiode 140. For example, the photodiode may have a thickness of 0.5 to 2.0 μm.

Figure 3:
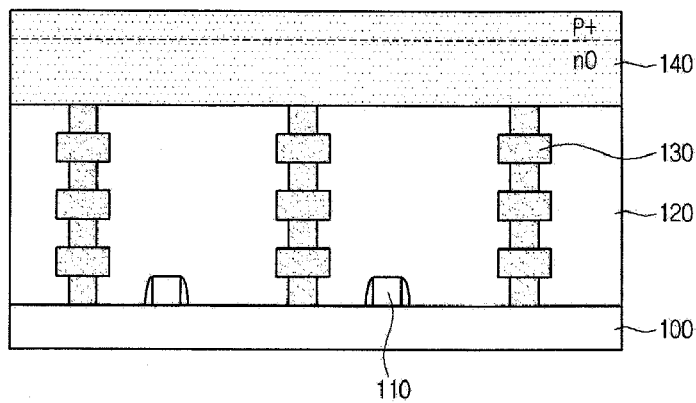

Referring to example FIG. 3, a photodiode 140 may be formed on, or over, the interlayer dielectric 120 arranged on the semiconductor substrate 100. For example, the crystalline semiconductor substrate 20 including the photodiode 140 may be joined to the semiconductor substrate 100. The joining may be carried out through a bonding process, for example. The surface of the photodiode 140 of the crystalline semiconductor substrate 20 may be arranged on, or over, the interlayer dielectric 120 and the top of the semiconductor substrate 100 so that they may then be bonded to each other such that they are joined together. When the semiconductor substrate 100 is joined to the crystalline semiconductor substrate 20, the plug of the metal line may be electrically connected to the photodiode 140 of the crystalline semiconductor substrate 20.

Then, the crystalline semiconductor substrate 20 may be removed, such that the photodiode 140 remains on the semiconductor substrate 100. When the crystalline semiconductor substrate 20 is removed, the photodiode 140 is left on the semiconductor substrate 100. For example, the crystalline semiconductor substrate 20 may be removed by etching or chemical mechanical polishing (CMP). Accordingly, the photodiode 140 remains on the semiconductor substrate 100, thus realizing vertical integration between the semiconductor substrate 100 and the photodiode 140.

Figure 4:
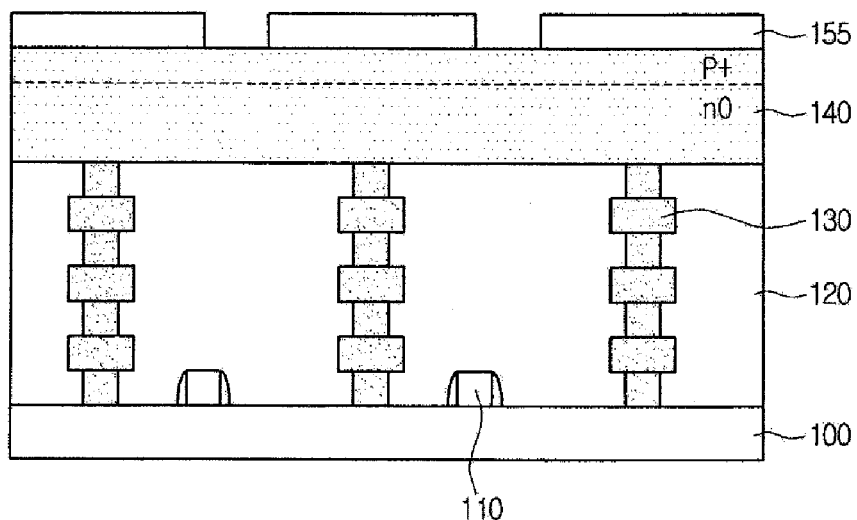

Referring to example FIG. 4, hard mask patterns 155 may be formed on, or over, the photodiode 140. The hard mask patterns 155 may serve to partition the diode 140 into respective unit pixels. The hard mask patterns 155 may be formed by forming a hard mask layer on the photodiode 140 and performing photolithographic and etching processes. The hard mask patterns 155 may, for example, be formed above the respective metal lines 130 on the photodiode 140, but not necessarily. Accordingly, the hard mask patterns 155 may selectively expose a portion of the photodiode 140 interposed between the metal line 130 and the hard mask pattern. For example, the hard mask patterns 155 may be formed of an oxide film including TEOS. In addition, the hard mask patterns 155 may have a thickness of about 3,000 to about 5,000 Å and may be larger than the metal lines 130.

Figure 5:
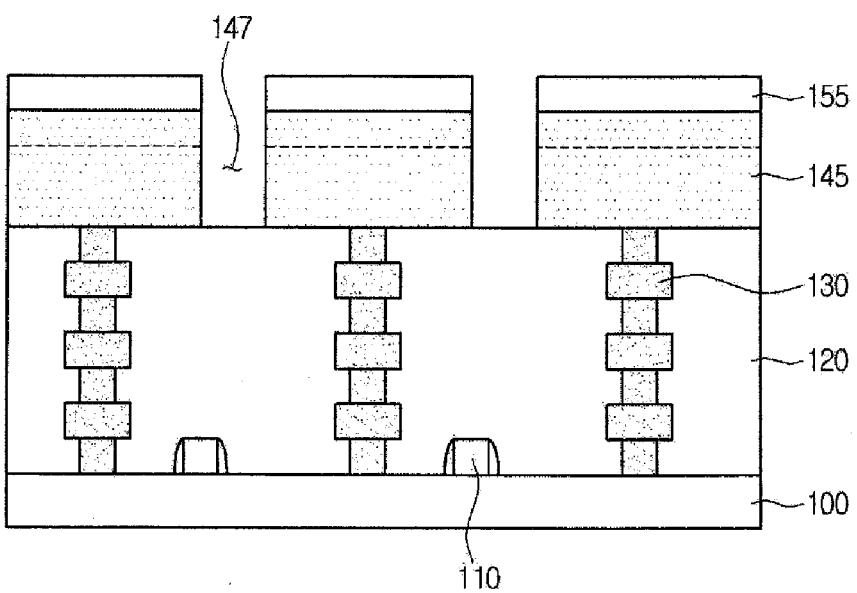

Referring to example FIG. 5, photodiode patterns 145 may be formed on, or over, the interlayer dielectric 120. The photodiode patterns 145 may be formed, for example, by etching the exposed photodiode 140 using the hard mask patterns 155 as etching masks. As a result, photodiode patterns 145 and device-isolation trenches 147 may be formed on, or over, the interlayer dielectric 120. The adjacent photodiode patterns 145 may be isolated from each other in respective unit pixels through the device-isolation trench 147 and may be electrically connected to the respective metal lines 130. In addition, the device-isolation trench 147 may be exposed to the surface of the interlayer dielectric 120 interposed between the photodiode patterns 145. In particular, the device-isolation trench 147 may be in the form of a dip trench due to the height of the photodiode 140. The photodiode patterns 145 and the device-isolation trenches 147 may be formed using any of a variety of different processes such as, for example, through a plasma etching process.

Because the photodiode 140 may be patterned through a plasma etching process, electrons may be unexpectedly generated on the surface of etched photodiode 140 due to plasma damage. That is, because the photodiode 140 may be formed on the crystalline semiconductor substrate 20, when the crystalline semiconductor substrate 20 is etched, lattice defects such as dangling bond may occur, inducing dark current and causing deterioration of low luminance properties.

Figure 6:
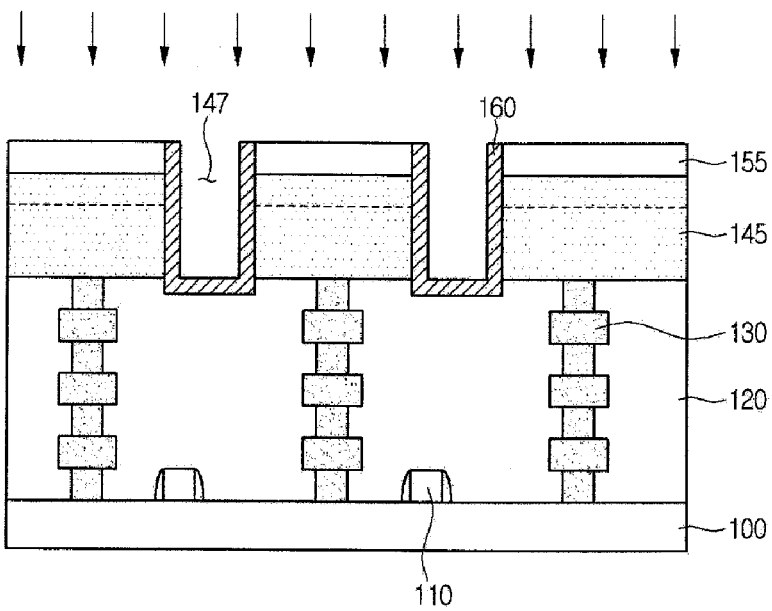

Referring to example FIG. 6, a barrier film 160 may be formed in the device-isolation trench 147. The barrier film 160 may serve to compensate for the side of the photodiode pattern 145 damaged by the plasma etching process. That is, the barrier film 160 may be formed such that it surrounds the surface of the device-isolation trench 147. The barrier film 160 may be formed by implanting P-type impurities, for example, into the photodiode pattern 145 and the device-isolation trench 147 using the hard mask patterns 155 as ion-implantation masks. The barrier film 160 may be formed from a variety of different materials such as, for example, $BF_2$ ions.

Because the hard mask patterns 155 may be formed on the photodiode pattern 145, $BF_2$ ions, or other ions, may be implanted into the sidewall of the device-isolation trench 147 interposed between the adjacent photodiode patterns 145, to form the barrier film 160. Further, after implantation of the $BF_2$ ions, or other ions, an annealing process may be performed. The barrier film 160 may be formed on the side of the photodiode pattern 145 through the device-isolation trench 147. Accordingly, a damaged region of the photodiode pattern 145 can be recovered by the $BF_2$ ions, or other ions. Accordingly, the barrier film 160 may be formed on the side of the photodiode 140, thus minimizing defects such as dangling bonds, minimizing the occurrence of dark current, and maximizing low luminance properties.

Referring to example FIG. 7, a device-isolation insulating layer 170 may be formed on, or over, the interlayer dielectric 120 including the photodiode patterns 145 and the device-isolation trench 147. The device-isolation insulating layer 170 may be formed over the interlayer dielectric 120 such that it covers both the photodiode patterns 145 and the device-isolation trench 147. For example, the device-isolation insulating layer 170 may be formed of an oxide film.

Because the device-isolation insulating layer 170 may be formed such that it fills the device-isolation trench 147, the photodiode patterns 145 can be separated in respective unit pixels through the device-isolation insulating layer 170. Additionally, an upper electrode, color filters or microlenses may be formed on the device-isolation insulating layer.

According to embodiments, a photodiode may be formed on, or over, the semiconductor substrate including the metal lines that accomplishes vertical integration of image sensors. In addition, because the photodiodes are formed in the crystalline semiconductor substrate, photodiode defects can be minimized. Also, the photodiodes may be separated in respective unit pixels through the device-isolation insulating layer, thus reducing occurrence of crosstalk and noise. Defects such as dangling bonds which may occur upon etching of the photodiode are restored, and dark current and low luminance properties can thus be maximized.

According to embodiments, image sensors are realized that include vertical integration of transistor circuitry and photodiodes and that approach a fill factor of 100% due to the vertical integration of transistor circuitry and photodiode. Also, according to embodiments high sensitivity under conditions of the same pixel size may be provided because of the vertical integration. Furthermore, process costs for realizing the same resolution may be minimized and complicated circuitry, without a decrease in sensitivity of respective unit pixels, may be realized.

Also, the additional on-chip circuitry integrated according to embodiments may permit maximizing performance of image sensors, the miniaturization of devices, and a reduction of manufacturing costs. Also, according to embodiments, it is possible to employ vertical photodiodes and prevent, or minimize, defects in the photodiodes and to restore defects such as dangling bonds which may occur upon etching of the photodiode, and thus maximize dark current and low luminance properties.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An image sensor comprising:
a semiconductor substrate including circuitry;
an interlayer dielectric including metal lines arranged over the semiconductor substrate;
crystalline photodiode patterns arranged over the interlayer dielectric such that the photodiode patterns are electrically coupled with the metal lines;
hard mask patterns arranged over respective crystalline photodiode patterns;
a respective device-isolation trench located between adjacent crystalline photodiode patterns;
a barrier film implanted with impurity ions, arranged on an inner wall of each device-isolation trench; and
a device-isolation insulating layer arranged over the interlayer dielectric, the crystalline photodiode patterns, and the device-isolation trenches.

2. The image sensor according to claim 1, wherein each device-isolation trench is configured to isolate adjacent crystalline photodiode patterns from each other.

3. The image sensor according to claim 1, wherein the barrier film comprises a P-type impurity.

4. The image sensor according to claim 1, wherein the interlayer dielectric comprises a plurality of dielectric layers.

5. The image sensor according to claim 1, wherein one or more of the metal lines comprises at least one of aluminum, copper, cobalt and tungsten.

6. The image sensor according to claim 1, wherein the barrier film is formed on a side of a respective crystalline photodiode pattern by implanting ions into the respective crystalline photodiode pattern through the respective device-isolation trench.

7. The image sensor according to claim 6, wherein the ions comprise $BF_2$ ions.

8. A method for manufacturing an image sensor, comprising:
forming a semiconductor substrate including circuitry;
forming an interlayer dielectric including a metal line over the semiconductor substrate;
joining a crystalline photodiode with the interlayer dielectric such that the photodiode is electrically coupled with the metal line;
forming a hard mask pattern over the photodiode to form a photodiode pattern including a device-isolation trench;
implanting impurities into the inner wall of the device-isolation trench to form a barrier film; and
forming a device-isolation insulating layer over the interlayer dielectric, the photodiode pattern and the device-isolation trench.

9. The method according to claim 8, comprising:
forming a device-isolation film on the semiconductor substrate, to define an active region and a field region.

10. The method according to claim 8, wherein the interlayer dielectric comprises a plurality of layers.

11. The method according to claim 8, wherein the metal line comprises one of aluminum, copper, cobalt and tungsten.

12. The method according to claim 8, wherein joining of the crystalline photodiode and the interlayer dielectric is carried out through a bonding process.

13. The method according to claim 8, wherein the hard mask pattern comprises an oxide film including TEOS.

14. The method according to claim 8, wherein the hard mask pattern has a thickness between about 3,000 to about 5,000 Å.

15. The method according to claim 8, wherein forming the barrier film includes implanting P-type impurities into the device-isolation trench.

16. The method according to claim 15, wherein the barrier film comprises $BF_2$ ions.

17. An image sensor comprising:
a semiconductor substrate including circuitry;
an interlayer dielectric including one or more conductive lines arranged over the semiconductor substrate;
one or more photodiode patterns arranged over the interlayer dielectric such that the photodiode patterns are connected to the metal lines;
a hard mask pattern arranged over each respective photodiode patterns;
a device-isolation trench located between adjacent photodiode patterns;
a barrier film implanted with impurity ions, arranged on the inner wall of the device-isolation trench; and
a device-isolation insulating layer arranged over the one or more photodiode patterns and the device-isolation trench.

18. The image sensor according to claim 17, wherein the one or more conductive lines are comprised of at least one of a metal, an alloy, and a silicide.

19. The image sensor according to claim 17, wherein each of the one or more photodiode patterns comprise a crystalline photodiode pattern.

20. The image sensor according to claim 17, wherein the barrier film comprises $BF_2$ ions.

* * * * *